United States Patent
Chang (10) Patent No.: US 7,187,584 B2
(45) Date of Patent: Mar. 6, 2007

(54) METHOD OF READING MULTI-LEVEL NAND FLASH MEMORY CELL AND CIRCUIT FOR THE SAME

(75) Inventor: Seung Ho Chang, Chungcheongbuk-do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 81 days.

(21) Appl. No.: 11/008,486

(22) Filed: Dec. 9, 2004

(65) Prior Publication Data

US 2005/0213378 A1    Sep. 29, 2005

(30) Foreign Application Priority Data

Mar. 23, 2004    (KR) .................... 10-2004-0019745

(51) Int. Cl.
    *G11C 16/04*    (2006.01)
(52) U.S. Cl. .................... 365/185.17; 365/185.12
(58) Field of Classification Search ........... 365/185.12, 365/185.17
    See application file for complete search history.

(56) References Cited

U.S. PATENT DOCUMENTS

| | | | | |
|---|---|---|---|---|
| 5,768,188 A | * | 6/1998 | Park et al. ............. | 365/185.03 |
| 6,373,748 B2 | * | 4/2002 | Ikehashi et al. ....... | 365/185.22 |
| 6,671,204 B2 | * | 12/2003 | Im .......................... | 365/185.12 |
| 6,813,214 B2 | * | 11/2004 | Cho et al. .............. | 365/230.04 |
| 6,963,502 B2 | * | 11/2005 | Park ....................... | 365/185.11 |
| 6,996,014 B2 | * | 2/2006 | Lee et al. .............. | 365/189.05 |

FOREIGN PATENT DOCUMENTS

KR    100172408 B1    10/1998

* cited by examiner

*Primary Examiner*—Hoai V. Ho
(74) *Attorney, Agent, or Firm*—Marshall, Gerstein & Borun LLP (57) ABSTRACT

The disclosed is a method of reading a multi-level NAND flash memory cell and a circuit for the same. The read circuit for the NAND flash memory device includes a NAND flash memory cell having multi-level information, a first page buffer for storing an upper-bit, a second page buffer for storing a lower bit, and pass transistor for changing information of the second page buffer according to a variation of the first page buffer. In accordance with the present invention, "00" or "01" information is read out by applying a first voltage to a word line of the cell. "00", "01", or "11" information is read out by applying a second voltage to the word line. A latch pass control signal is applied to a pass transistor. Thus, it is possible to read out "00", "01", "11", or "10" information.

17 Claims, 3 Drawing Sheets

METHOD OF READING MULTI-LEVEL NAND FLASH MEMORY CELL AND CIRCUIT FOR THE SAME

BACKGROUND

1. Field of the Invention

The present invention is directed to methods of reading a multi-level flash memory and more particularly, a method of reading a multi-level flash memory used as mass data storage memory applicable in the field such as digital cameras, MP3 players etc.

2. Discussion of Related Art

In general, as flash memory cells store only a single bit, there is a problem incapable of reading information of a multi-level cell storing data more than two bit levels.

In addition, even multi-level sensing circuits proposed in recent are hardly available in systems using gray codes.

SUMMARY OF THE INVENTION

It is therefore an object of the present invention to provide a method of reading a multi-level NAND flash memory capable of using a gray code by employing a first page buffer for storing an upper-bit to a bit line and a second page buffer for storing a lower bit.

One aspect of the present invention is to provide a read circuit for a multi-level NAND flash memory cell in which comprises a cell string where plural cells for storing multi-level information are connected serially; plural word lines connected to a gate terminal of each cell string; a bit line connected to a drain terminal of the cell string; a first page buffer for storing upper-bit information among information of a cell selected by the word line and the bit line; a second page buffer for storing lower bit information of the selected cell; and a pass unit driven according to a latch pass control signal and driving the second page buffer to change information of the second page buffer.

In another aspect of the present invention, there is provided a read circuit for a multi-level NAND flash memory cell in which comprises first and second cell strings where plural cells for storing multi-level information are; connected serially; plural word lines connected to a gate terminal of each of the first and second cell strings; even and odd bit lines respectively connected to a drain terminal of the first and second cell strings; first and second bit line selection transistors selecting one of bit line among the even or odd bit line according to a bit line selection signal; a first page buffer connected to the first and second bit line selection transistors to store upper-bit information among information of a selected cell; a second page buffer connected to the first and second bit line selection transistors to store lower bit information among information of a selected cell; and a pass unit driven according to a latch pass control signal and driving the second page buffer to change information of the second page buffer.

In still another aspect of the present invention, there is provided a read circuit for a multi-level NAND flash memory including a cell string where plural cells for storing multi-level information are connected serially; a bit line connected to a drain terminal of the cell string; a first page buffer for storing upper-bit information among information of a cell selected by the word line and the bit line, and a second page buffer for storing lower bit information of the selected cell; and a pass unit driving the second page buffer to change information of the second page buffer, the read circuit comprises the steps of: resetting the first and second page buffers; applying a first voltage to the selected word line, reading data stored in the cell by a reading operation, and then storing the second page buffer according to the lower bit latch signal; applying a second voltage to the selected word line, reading data stored in the cell by the reading operation, and then storing the first page buffer according to the upper-bit latch signal; and storing logic low data to the second page buffer by driving the second page buffer through the pass unit if logic high data is stored in the first page buffer according to the upper-bit latch signal and the latch pass control signal by reading data stored in the cell through the reading operation after applying a third voltage to the selected word line.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Hereinafter, it will be described about an exemplary embodiment of the present invention in conjunction with the accompanying drawings.

Figure 1:
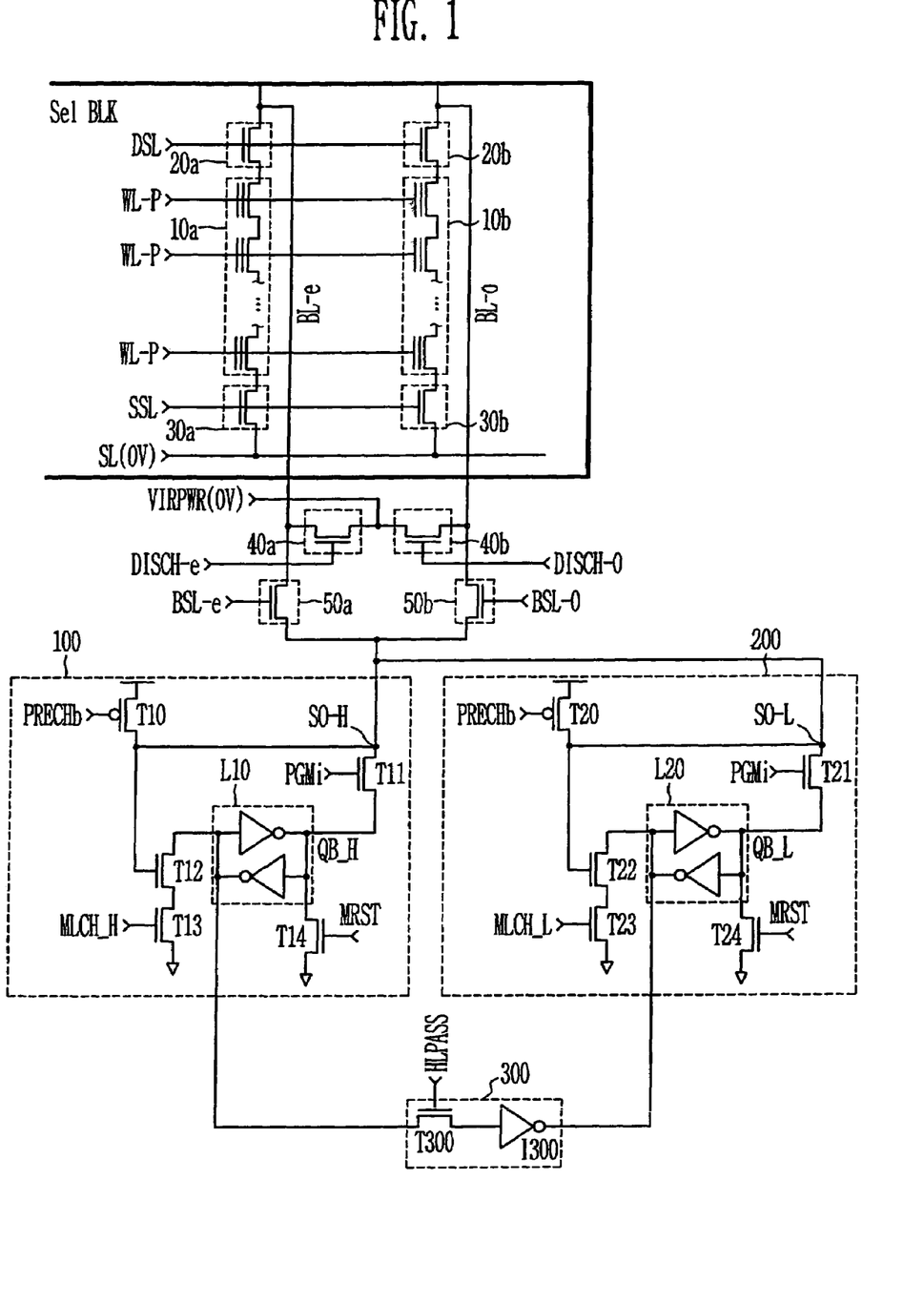
FIG. 1 is a circuit diagram of a multi-level NAND flash cell according to the present invention.

FIG. 1 is a circuit diagram of a multi-level NAND flash cell according to the present invention.

Referring to FIG. 1, a read circuit for the multi-level NAND flash cell includes a cell string 10, plural word lines WL, a bit line BL, a first page buffer 100, a second page buffer 200, and a pass unit 300. In the cell string 10, plural cells for storing multi-level information are connected serially. Plural word lines WL are connected to a gate terminal of each cell string 10. The bit line BL is connected to a drain terminal of the cell string 10, respectively. The first page buffer 100 stores upper-bit information among information of a cell selected by the word line WL and the bit line BL. The second page buffer 200 stores lower bit information of the selected cell. The pass unit 300 is driven according to a latch pass control signal HLPASS and drives the second page buffer 200 by the first page buffer 100 to change information of the second page buffer-200.

A drain selection transistor 20, a source selection transistor 30, and a discharge transistor 40 are further included. The drain selection transistor 20 is connected between a drain terminal of the cell string 10 and the bit line BL to be driven according to a drain selection signal DSL. The source selection transistor 30 is connected between a source terminal of the cell string 10 and a common ground line SL to be driven according to a source selection signal SSL. The discharge transistor 40 discharges the bit line BL according to a predetermined discharge signal DISCHe.

In addition, the read circuit for the multi-level flash memory cell includes first and second cell strings 10a and 10b, plural word lines WL, even and odd bit lines BL-e and BL-o, first and second bit line selection transistors 50a and 50b, a first page buffer 100, a second page buffer 200, and a pass unit 300. In the first and second cell strings 10a and 10b, plural cells for storing multi-level information are connected serially. Plural word lines are connected to a gate terminal of each of the first and second cell strings 10a and 10b. The even and odd bit lines BL-e and BL-o are connected to a drain terminal of the first and second strings 10a and 10b. The first and second bit line selection transistors 50a and 50b select one of bit line BL among the even and odd bit lines BL-e and BL-o according to a bit line selection signal BSLe and BSLo. The first page-buffer 100 is connected to the first and second bit line selection transistors 50a and 50b to store upper-bit information among information of a selected cell. The second page buffer 200 is connected to the first and second bit line selection transistors 50a and 50b to store lower bit information among information of the selected cell. The pass unit 300 is driven according to a latch pass control signal HLPASS and drives the second page buffer 200 to the first page buffer 100 to change information of the second page buffer 200.

Moreover, first and second drain selection transistors 20a and 20b, first and second source selection transistors 30a and 30b, and first and second discharge transistors 40a and 40b are further included. The first and second drain selection transistors 20a and 20b are connected between a drain terminal of the first cell string 10a and the even bit line BL-e, and between a drain terminal of the second cell string 10b and the odd bit line BL-o to be driven according to the drain selection signal. The first and second source selection transistors 30a and 30b are connected between a source terminal of the first and second cell strings 10a and 10b and common ground line SL to be driven according to the source selection signal SSL. The first and second discharge transistors 40a and 40b discharge the even or bit line BL-e or the odd bit line (BL-e or BL-o) according to an even or odd discharge signal (DISCH-e or DISCH-o), respectively.

The first page buffer 100 includes a bit decision node SO-H, a tenth latch L10, a tenth transistor T10, an eleventh transistor T11, and twelfth and thirteenth transistors T12 and T13. The bit decision node SO-H receives a predetermined signal from the bit line BL or transfers the predetermined signal to the bit line BL. The tenth latch L10 stores predetermined data. The tenth transistor T10 transfers a predetermined precharge voltage to the bit decision node SO-H according to a precharge signal PRECHb. The eleventh transistor T11 transfers data stored in the tenth latch L10 to the bit decision node SO-H according to a program signal PGMi. The twelfth and thirteenth transistors are serially connected between the tenth latch L10 and a ground power to change data /QB of the tenth latch L10 according to a bit decision node signal and an upper-bit latch signal MLCH-H. The fourteenth transistor T14 is further included. The fourteenth transistor T14 is connected between the tenth latch L10 and the ground power to set the data /QB of the tenth latch L10 to logic low according to a reset signal MRST.

The second page buffer 200 includes a bit decision node SO-L, a twentieth latch L20, a twentieth transistor T20, a twenty first transistor T21, and twenty second and twenty third transistors. The bit decision node SO-L receives a predetermined signal from the bit line BL or transfers the predetermined signal to the bit line BL. The twentieth latch L20 stores predetermined data. The twentieth transistor T20 transfers a predetermined precharge voltage to the bit decision node SO-L according to the precharge signal PRECHb. The twenty first transistor T21 transfers data stored in the twentieth latch L20 to the bit decision node SO-L according to a program signal PGMi. The twenty second and twenty third transistors T22 and T23 are serially connected between the twentieth latch L20 and a ground power to change data /QB of the twentieth latch L20 according to a bit decision node signal and a lower bit latch signal MLCH-L. The twenty fourth transistor T24 is further included. The twenty fourth transistor T24 is connected between the twentieth latch L20 and the ground power to set the data /QB of the twentieth latch L20 to logic low according to a reset signal MRST.

The pass unit 300 a pass transistor T300 and a pass inverter I300. The pass transistor T300 is serially connected between the first latch L10 of the first page buffer 100 and the second latch L20 of the second page buffer 200 to be driven according to the latch pass control signal HLPASS. The pass inverter I300 converts a signal of the first latch L10.

It is preferable that the tenth and twentieth transistors T10 and T20 use a PMOS transistor, and the rest of transistors use a NMOS transistor.

The present invention will be described with reference to the drawings.

Figure 2:
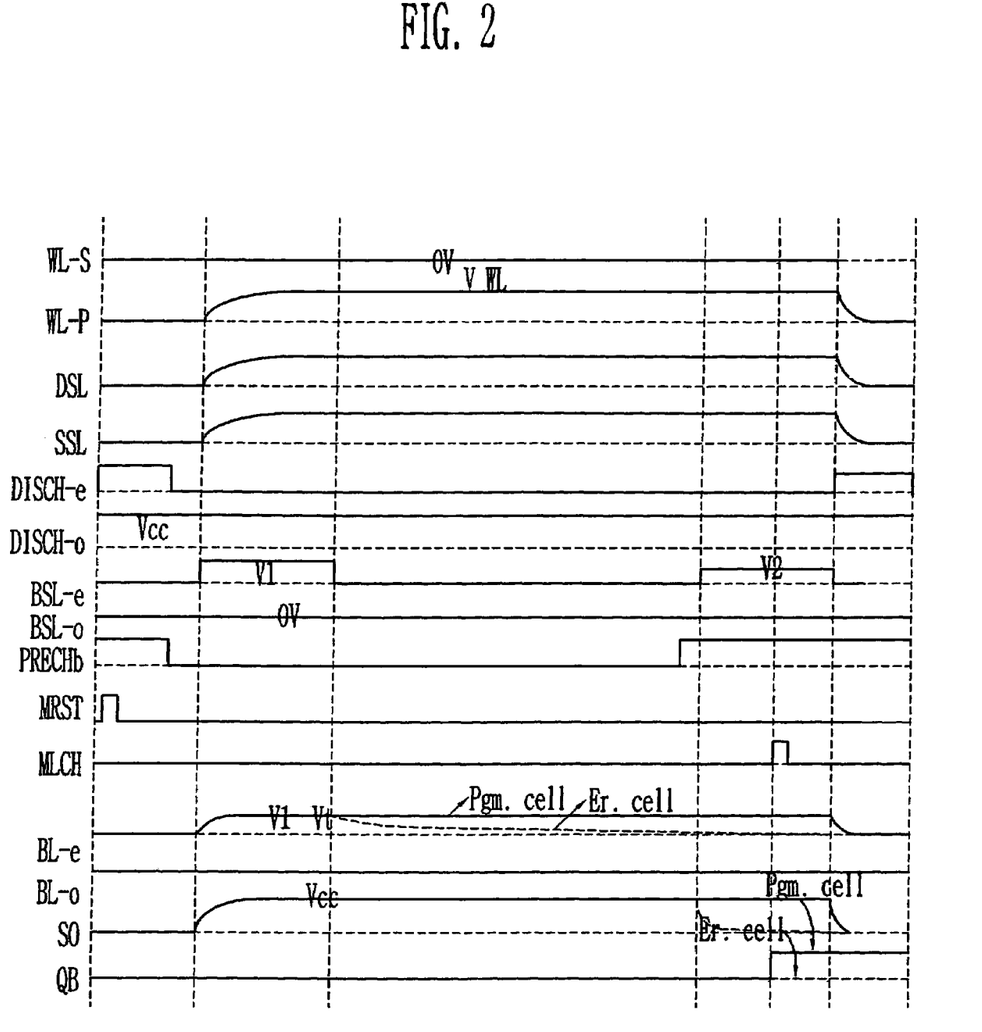
FIG. 2 is a waveform diagram for a reading operation of the multi-level NAND flash cell to the present invention.

FIG. 2 is a waveform diagram for a reading operation of the multi-level NAND flash memory cell according to the present invention.

Figure 3:
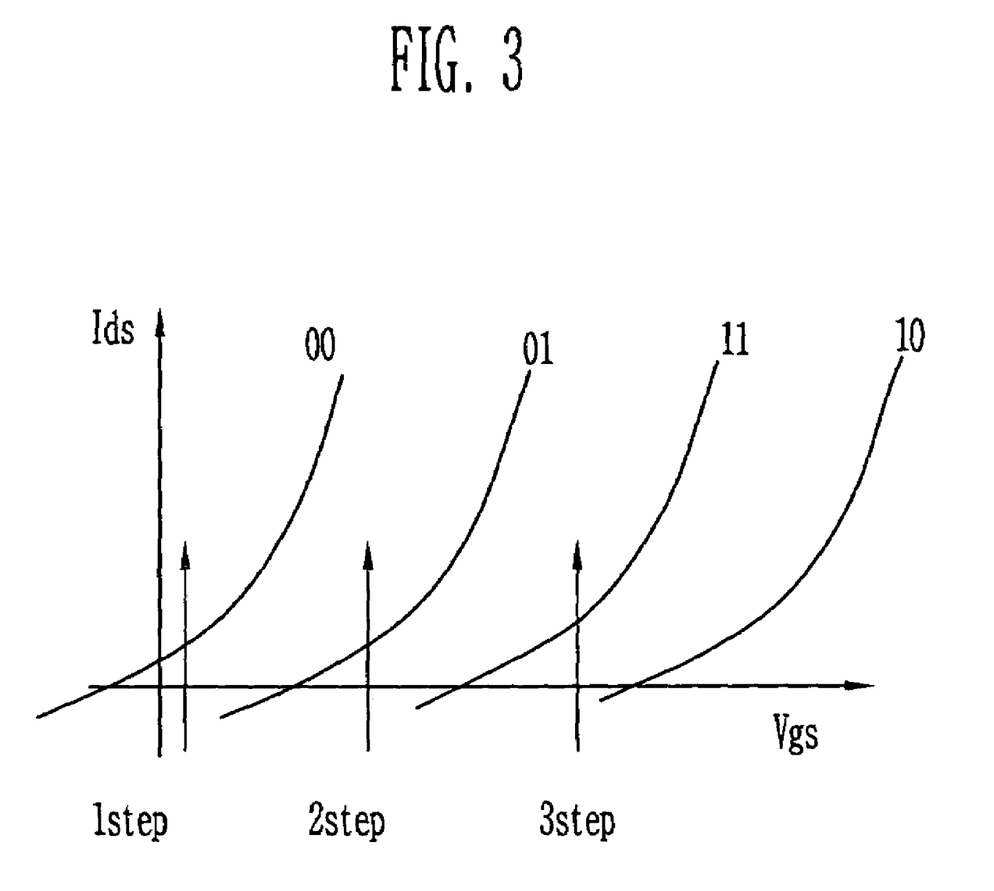
FIG. 3 is a schematic diagram illustrating a read method according to a threshold voltage of the multi-level NAND flash cell.

FIG. 3 is a schematic diagram illustrating a read method according to a threshold voltage of the multi-level NAND flash cell.

With reference to FIGS. 1 to 3, the first and second page buffers 100 and 200 are reset. This means that latch data in the first and second page buffers 100 and 200 is set to logic low. After applying a first voltage to a selected word line WL-s, data stored in the cell through a cell reading operation is read out and is stored in the second page buffer 200 according to a lower bit latch signal MLCH-L. After applying a second voltage to the selected word line WL-s, data stored in the cell through the cell reading operation is red out and stored in the first page buffer 100 according to an upper-bit latch signal. In case that data stored in the cell through the cell reading operation is read out, and logic high data is stored in the first page buffer according to the upper-bit latch signal MLCH-L and the latch pass control signal HLPASS after applying a third voltage to the selected word line WL-s, the pass transistor T300 and the pass inverter I300 in the pass unit 300 drives the second page buffer 2200 so that logic low data is stored in the second page buffer 200.

In order to operate the pass transistor T300 in the pass unit 300 normally, it is preferable that the size of the pass transistor T300 is controlled. For example, it is preferable that a latch of the second page buffer 200 is not driven by only latch of the first page buffer 100, but is driven only when a latch of the first page buffer 100 and the transistor T13 receiving the upper-bit latch signal MLCH-L are operated together.

In accordance with the present invention, a state of a cell ("00" or "01") is acknowledged through the first and second page buffers 100 and 200 by applying a first voltage to the word line WL-s. A state of a cell ("00" or "11") is acknowledged through the first and second page buffers 100 and 200 by applying a second voltage to the word line WL-s. A state of a cell ("11" or "10") is acknowledged through the first and second page buffers 100 and 200 by applying a third voltage to the word line WL-s. A pass voltage is applied to a non-selected word line WL-p. It is preferable that the pass voltage is between 4.0V through 5.0V.

It is preferable that a voltage interval of the first to third voltage is the same as an interval of a threshold voltage interval of a cell having a multi-level cell. For instance, if the threshold voltage of the cell is set to 1V, 2V, 3V, and 4V, 1V, 2V, 3V, and 4V are set to "00", "01", "11", and "10", respectively. By applying 0V to the first voltage, "00" or "01" can be determined. By applying 1V to the second voltage, "01," or "11" can be determined. By applying 2V to the third voltage, "11" or "10" can be determined.

The above-mentioned read method is described referring to the circuit diagram and the waveform diagram as followings. In the present embodiment, one of cell among the cell strings 10a connected to the even bit line BL-e and is read out.

By applying the even discharge signal DISCH-e of logic high, the even bit line BL-e is discharged. By applying the precharge signal PRECHb of logic low, a predetermined precharge signal is applied to the bit decision node SO. At this time, the tenth and twentieth latches L10 and L20 in the first and second page buffers 100 and 200 are reset to logic low by applying the reset signal MRST.

By applying a first even bit line selection signal BSL-e of logic high, the even bit line selection transistor 50a is turned on. As a result, the precharge signal of the bit decision node SO is applied to the even bit line BLe. At this time, the first voltage is applied to the word line WL-s of the selected cell, and a pass voltage is applied to the non-selected word line. In this case, the drain selection transistor 20a and the source selection transistor 30a are turned on by respectively applying a high voltage to the drain selection line DSL and the source selection line SSL.

A current flow between the bit line and the bit line decision node SO is cut off by applying the even bit line signal BSL-e of logic low. Then, wait that a charge of the bit line BSL-e is discharged or is holding. At this time, the threshold voltage of the selected cell is higher than a voltage applied to the word line WL-s, a precharge voltage signal of the bit line BL-e maintains the level of the signal. To the contrary, if the threshold voltage of the cell is lower than a voltage applied to the word line WL-s, the precharge signal of the bit line BL-e is discharged to the common ground line SL.

Applying the precharge voltage to the bit decision node SO is stopped by applying the precharge signal PRECHb of logic high.

The even bit line selection transistor 50a is turned on by applying the second even bit line selection signal BSL-e of logic high so that a voltage signal state of the even bit line BL-e is applied to the bit decision node SO. If the precharge voltage signal of the even bit line BL-e is maintained, a logic high signal is applied to the bit decision node SO. If the precharge voltage signal is discharged, a logic low signal is applied to the bit decision node SO.

Accordingly, the twentieth and twenty second transistors T12 and T22 become turned on or turned off depending on a state of the bit decision node SO. The lower bit latch signal MLCH-L is logic high to turn on the twenty third transistors T23. As a result, data of the twentieth latch L20 becomes "0" or "1" depending on a state of the bit decision node SO. However, the tenth latch L10 maintains an initial value irrespective of the state of the bit decision node SO because the thirteenth transistor T13 is turned off.

Concretely, if a voltage of the bit line BL is discharged (the bit decision node SO is logic low) depending on a state of the selected cell, the twelfth and twenty second transistors T12 and T22 are turned off so that the tenth and twentieth latches L10 and L20 maintains a previous state. In other words, cell data of "00" is read out by the tenth and twentieth latches L10 and L20. In the meanwhile, the voltage of the bit line BL is maintained according to the state of the selected cell (the bit decision node SO is high), the twelfth and twenty second transistors T12 and T22 are turned on. The thirteenth transistor T13 is turned off so that the tenth latch L10 maintains a previous data value. Depending on the lower bit latch signal MLCH-L, the twenty third transistor T23 is turned on so that the data value of the twentieth latch L20 is changed to "1". For this reason, cell data of "01" is read out by the tenth and twentieth latches L10 and L20.

Data of the cell is read out by applying the first voltage to the word line WL-s and applying the lower bit signal MLCH-L. Then, cell data is read out by applying the second voltage to the word line WL-s and applying the upper-bit latch signal MLCH-L. This will be described as followings. In the present invention, applying the lower bit latch signal and upper-bit latch signal means that a logic high voltage is applied.

The even bit line BL-e may be discharged by applying the even discharge signal DISH-e. By applying the precharge signal PRECHb of logic low, a predetermined precharge signal is applied to the bit decision node SO. At this time, the reset signal applied in the previous step is not applied. The reason for this is that the tenth and twentieth page buffers L10 and L20 store "00" or "01," data by the tenth and twentieth latches L10 and L20.

The even bit line selection transistor 50a is turned on by applying the first even bit line selection signal BSL-e of logic high so that the precharge voltage signal of the bit decision node SO is applied to the even bit line BL-e. At this time, the second voltage is applied to the word line WL-s of the selected cell, and a pass voltage is applied to the non-selected word line WL-p. In this case, the drain selection transistor 20a and the source selection transistor 30a are turned on by respectively applying a high voltage to the drain selection line DSL and the source selection line SSL.

By turning off the even bit line selection transistor 50a during a predetermined time, wait that a charge of the bit line BL-e is discharged or is holding. A voltage signal state of the bit line BL-e is applied to the bit decision node SO by cutting off a precharge voltage applied to the bit decision node SO and applying the second bit line selection signal BSL-e of logic high. As stated above, the twelfth and twenty second transistors T12 and T22 are turned on or turned off depending on a state of the bit decision node SO At this time, the upper-bit latch signal MLCH-L becomes logic high so that the thirteenth transistor T13 is turned on.

Therefore, data of the tenth latch L10 becomes "0" or "1" depending on a state of the bit decision node SO. The twentieth latch L20 maintains a previous state irrespective of a state of the bit decision node SO because the twenty third transistor T23 is turned off.

Concretely, if a voltage of the bit line BL-e is discharged (the bit decision node is logic low) depending on a state of the selected cell, the twelfth and twenty second transistors T12 and T22 are turned off so that the tenth and twentieth latches L10 and L20 maintains a previous state. That is, cell data of "00" or "01" stored in the tenth and twentieth latches L10 and L20 is read out. In the meanwhile, if a voltage of the bit line BL-e is maintained depending on a state of the selected cell (the bit decision node is logic high), the twelfth and the twenty second transistors T12 and T22 are turned on. The twenty third transistor T23 is turned off so that the twentieth latch L20 maintains a previous value ("0" or "1").

The thirteenth transistor T13 is turned on depending on the upper-bit latch signal MLCH-L to change data value of the tenth latch to "1". As a result, cell data of "11" is read out by the tenth and twentieth latches L10 and L20.

Cell data is read out by applying the second voltage to the word line WL-s and applying the upper-bit latch signal MLCH-L. Then, cell data is read out by applying the third voltage to the word line WL-s to the word line WL-s and applying the upper-bit latch signal and the latch pass control signal HLPASS.

The even bit line BL-e may be discharged by applying the even bit lie discharge signal DISH-e. By applying the precharge signal of logic low, a predetermined precharge signal is applied to the bit decision node SO.

The even bit line selection transistor 50a is turned on by applying the first even bit line selection signal BSL-e of logic high so that the precharge voltage signal of the bit decision node SO is applied to the even bit line BL-e. At this time, the third voltage is applied to the word line WL-s of the selected cell, and a pass voltage is applied to the non-selected word line WL-p.

Wait that the charge of the bit line BL-e is discharged or is holding by; turning off the even bit line selection transistor 50a during a predetermined time. The voltage signal state of the bit line BL-e is applied to the bit decision node SO by cutting off the precharge voltage applied to the bit decision node SO and applying the second bit line selection signal BSL-e of logic high.

The twelfth and twenty second transistors T12 and T22 are turned on or turned off depending on the state of the bit decision node SO. At this time, the upper-bit latch signal MLCH-L becomes logic high to turn on the thirteenth transistor T13, and the pass transistor T300 is turned on according to the latch pass control signal HLPASS.

Therefore, data of the tenth latch L10 is maintained in a previous state or is changed to "1" according to the state of the bit decision node SO. The twentieth latch L20 converts its data if data of the tenth latch L10 is changed to "1". In other words, if the tenth latch L10, and the twelfth and thirteenth transistors T12 and T13 are operated together, the pass transistor T300 is operated so that the twentieth latch L20 can be driven. This is possible by controlling the size of the pass transistor T300.

Concretely, if a voltage of the bit line BL-e is discharged according to the state of the selected cell (the bit decision node is logic low), the twelfth and twenty second transistors T12 and T22 are turned off so that the tenth and twentieth latches L10 and L20 are maintained in a previous state. That is, cell data of "00", "01", or "11" stored in the tenth and twentieth latches L10 and L20 is read out. In the meanwhile, the voltage of the bit line BL-e is maintained according to the state of the selected cell (the bit decision node is logic high), the twelfth and thirteenth transistors T12 and T13 are turned on to change data of the tenth latch L10 to "1". At this time, the pass transistor T300 is driven to transfer a logic low signal according to the turned on twelfth and thirteenth transistors T12 and T13, and the latch pass control signal HLPASS. After that, the logic low, signal is converted by the pass inverter 1300 to be inputted to a converter of the twentieth latch L20. As a result, data of the twelfth latch L20 is changed to "0". Accordingly, cell data of "10" is read out by the tenth and twentieth latches L10 and L20.

According to the present invention, whether storage information of the selected multi-level cell is "00" or "01" can be determined by applying the first voltage and applying the lower bit latch signal MLCH-L to the second page buffer 200. By applying the second voltage higher than the first voltage to the word line WL and the upper-bit latch signal MLCH-L to the first page buffer 100, it is possible to determine whether storage information of the selected multi-level cell is "00", "01", or "11" or not. In addition, by applying the third voltage higher than the second voltage to the word line WL, upper-bit latch signal MLCH-L to the first page buffer 100, and the latch pass control signal HLPASS to the pass unit 300, it is possible to determine whether storage information of the selected multi-level cell is "00", "01", "11", or "10" or not. Like this, it is possible to read out a gray code multi-level NAND flash memory cell.

As previously mentioned, the read circuit for the flash memory device of the present invention includes a NAND flash memory cell, a first page buffer for storing an upper-bit, a second page buffer for storing a lower bit, and a pass transistor for changing information of the second page buffer according to a variation of information of the first page buffer. "00" or "01" information is read out by applying the first voltage to the word line of the cell, and "00", "01", or "11" information is read out by applying the second voltage to the word line. In addition, it is possible to read out "00", "01", "11", or "10" information by applying the latch pass signal to the pass transistor.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A read circuit for a multi-level NAND flash memory comprising:
   a cell string where plural cells for storing multi-level information are connected serially;
   plural word lines connected to a gate terminal of each cell string;
   a bit line connected to a drain terminal of the cell string;
   a first page buffer having a first latch for storing upper-bit information among information of a cell selected by the word line and the bit line, and a second page buffer having a second latch for storing lower bit information of the selected cell; and
   a pass unit connected between the first latch and the second latch and driven according to a latch pass control signal so that information of the second latch is changed by information of the first latch.

2. The read circuit for a multi-level NAND flash memory as set forth in claim 1, further comprising:
   a drain selection transistor connected between the drain terminal of the cell string and the bit line to be driven according to a drain selection signal;
   a source selection transistor connected between the source terminal of the cell string and a common ground line to be driven according to a source selection signal; and
   a discharge transistor for discharging the bit line according to a predetermined discharge signal.

3. The read circuit for a multi-level NAND flash memory as set forth in claim 1, further comprising:
   first and second drain selection transistors connected between the drain terminal of the first cell string and an even bit line, and between the drain terminal of the second cell string and an odd bit line to be driven according to a drain selection signal;
   first and second source selection transistors respectively connected between the source terminal of the first and second cell strings and a common ground line to be driven according to a source selection signal; and first and second discharge transistors discharging the even or odd bit line according to an even or odd discharge signal.

4. The read circuit for a multi-level NAND flash memory as set forth in claim 1, wherein the first page buffer comprises:

a bit decision node receiving a predetermined signal from the bit line or transferring the predetermined signal to the bit line;

the first latch storing predetermined data;

a PMOS transistor transferring a predetermined precharge voltage to the bit decision node according to a precharge signal;

a first transistor transfening data stored in the first latch according to a program signal to the bit decision node; and second and third transistors connected between the first latch and a ground power to respectively change the data of the first latch according to the bit decision node signal and an upper-bit latch signal.

5. The read circuit for a multi-level NAND flash memory as set forth in claim 1, wherein the second page buffer comprises:

a bit decision node receiving a predetermined signal from the bit line or transferring the predetermined signal to the bit line;

the second latch storing predetermined data;

a PMOS transistor transferring a predetermined precharge voltage to the bit decision node according to a precharge signal;

a first transistor transferring data stored in the second latch according to a program signal to the bit decision node; and second and third transistors connected between the second latch and a ground power to respectively change the data of the latch according to the bit decision node signal and a lower bit latch signal.

6. The read circuit for a multi-level NAND flash memory as set forth in claim 1, wherein the pass unit includes:

a pass transistor connected between the first latch and the second latch to be driven according to the latch pass control signal; and a pass inverter connected between the pass transistor and the second latch.

7. A read circuit for a multi-level NAND flash memory comprising:

first and second cell strings where plural cells for storing multi-level information are connected serially;

plural word lines connected to a gate terminal of each of the first and second cell strings;

even and odd bit lines connected to a drain terminal of the first and second cell strings;

first and second bit line selection transistors selecting one of bit line among the even or odd bit line according to a bit line selection signal;

a first page buffer having a first latch and connected to the first and second bit line selection transistors to store upper-bit information among information of a selected cell;

a second page buffer having a second latch and connected to the first and second bit line selection transistors to store lower bit information among information of a selected cell; and a pass unit connected between the first latch and the second latch and driven according to a latch pass control signal so that information of the second latch is changed by information of the first latch.

8. The read circuit for a multi-level NAND flash memory as set forth in claim 7, wherein the first page buffer comprises:

a bit decision node receiving a predetermined signal from the bit line or transferring the predetermined signal to the bit line;

the first latch storing predetermined data;

a PMOS transistor transferring a predetermined precharge voltage to the bit decision node according to a precharge signal;

a first transistor transferring data stored in the first latch according to a program signal to the bit decision node; and second and third transistors connected between the first latch and a ground power to respectively change the data of the first latch according to the bit decision node signal and an upper-bit latch signal.

9. The read circuit for a multi-level NAND flash memory as set forth in claim 7, wherein the second page buffer comprises:

a bit decision node receiving a predetermined signal from the bit line or transferring the predetermined signal to the bit line;

the second latch storing predetermined data;

a PMOS transistor transferring a predetermined precharge voltage to the bit decision node according to a precharge signal;

a first transistor transferring data stored in the second latch according to a program signal to the bit decision node; and second and third transistors connected between the second latch and a ground power to respectively change the data of the latch according to the bit decision node signal and a lower bit latch signal.

10. The read circuit for a multi-level NAND flash memory as set forth in claim 7, wherein the pass unit includes:

a pass transistor connected between the first latch and the second latch to be driven according to the latch pass control signal; and a pass inverter connected between the pass transistor and the second latch.

11. A read circuit for a multi-level NAND flash memory including a cell string where plural cells for storing multi-level information are connected serially; a bit line connected to a drain terminal of the cell string; a first page buffer for storing upper-bit information among information of a cell selected by the word line and the bit line, and a second page buffer for storing lower bit information of the selected cell; and a pass unit driving the second page buffer to change information of the second page buffer, the read circuit comprises the steps of:

resetting the first and second page buffers;

applying a first voltage to the selected word line, reading data stored in the cell by a reading operation, and then storing the second page buffer according to the lower bit latch signal;

applying a second voltage to the selected word line, reading data stored in the cell by the reading operation, and then storing the first page buffer according to the upper-bit latch signal; and storing logic low data to the second page buffer by driving the second page buffer through the pass unit if logic high data is stored in the first page buffer according to the upper-bit latch signal and the latch pass control signal by reading data stored in the cell through the reading operation after applying a third voltage to the selected word line.

12. The read circuit for a multi-level NAND flash memory as set forth in claim 11, wherein the reading operation comprises the steps of:
- applying a logic high precharge voltage to the bit line through the first or second page buffer;
- waiting that a charge of the precharge voltage applied to the bit line discharges or is holding after cutting off a current flow between the first or second page buffer and the bit line;
- transferring a voltage state of the bit line to the first and second page buffers.

13. The read circuit for a multi-level NAND flash memory as set forth in claim 11, wherein data stored in the selected cell is read by applying the first voltage to the word line and applying the lower bit latch signal, and
- wherein storage data of the first page buffer is maintained logic "0" being a reset state, and
- wherein storage data of the second page buffer is maintained logic "0" or is changed to logic "1".

14. The read circuit for a multi-level NAND flash memory as set forth in claim 11, wherein data stored in the selected cell is read by applying the second voltage to the word line and the upper-bit latch signal, and
- wherein the storage data of the first page buffer is maintained in a previous logic state or is changed to logic "1", and
- wherein storage data of the second page buffer is maintained in a previous logic state.

15. The read circuit for a multi-level NAND flash memory as set forth in claim 11, wherein data stored in the selected cell is read by applying the third voltage to the word line, the upper-bit latch signal, and the latch pass control signal, and
- wherein the storage data of the first page buffer is maintained in a previous logic state or is changed to logic "1", and
- wherein the second page buffer is changed to logic "0" by the pass unit when data of the first page buffer is changed to logic "1", and
- wherein the second page buffer is maintained in a previous logic state in other cases.

16. The read circuit for a multi-level NAND flash memory as set forth in claim 11, wherein a voltage interval of the first to third voltage is the same as an interval of a cell threshold voltage.

17. The read circuit for a multi-level NAND flash memory as set forth in claim 7, further comprising:
- first and second drain selection transistors connected between the drain terminal of the first cell string and the even bit line, and between the drain terminal of the second cell string and the odd bit line to be driven according to a drain selection signal;
- first and second source selection transistors respectively connected between the source terminal of the first and second cell strings and a common ground line to be driven according to a source selection signal; and
- first and second discharge transistors discharging the even or odd bit line according to an even or odd discharge signal.

* * * * *

UNITED STATES PATENT AND TRADEMARK OFFICE
CERTIFICATE OF CORRECTION

Page 1 of 1

PATENT NO. : 7,187,584 B2
APPLICATION NO. : 11/008486
DATED : March 6, 2007
INVENTOR(S) : Seung H. Chang It is certified that error appears in the above-identified patent and that said Letters Patent is hereby corrected as shown below:

In the Claims:

At Column 9, line 16, "transfening" should be -- transferring --.

Signed and Sealed this
Thirty-first Day of May, 2011

David J. Kappos
*Director of the United States Patent and Trademark Office*